United States Patent
Iino

(10) Patent No.: US 7,999,442 B2
(45) Date of Patent: Aug. 16, 2011

(54) PIEZOELECTRIC ACTUATOR AND ELECTRONICS DEVICE USING THE SAME

(75) Inventor: Akihiro Iino, Chiba (JP)

(73) Assignee: Seiko Instruments Inc. (JP)

( * ) Notice: Subject to any disclaimer, the term of this patent is extended or adjusted under 35 U.S.C. 154(b) by 84 days.

(21) Appl. No.: 12/004,999

(22) Filed: Dec. 20, 2007

(65) Prior Publication Data

US 2008/0174205 A1   Jul. 24, 2008

(30) Foreign Application Priority Data

Dec. 22, 2006 (JP) .................. 2006-345870
Oct. 2, 2007 (JP) .................. 2007-258547

(51) Int. Cl.
  *H01L 41/09* (2006.01)
(52) U.S. Cl. ........ 310/331; 310/317; 310/332; 310/364; 381/190
(58) Field of Classification Search .............. 310/317, 310/328, 324, 364, 332
See application file for complete search history.

(56) References Cited

U.S. PATENT DOCUMENTS

| | | | |
|---|---|---|---|
| 5,233,256 A * | 8/1993 | Hayashi et al. ............. 310/317 |
| 5,889,354 A * | 3/1999 | Sager ........................ 310/331 |
| 6,389,302 B1 * | 5/2002 | Vance ........................ 455/567 |
| 6,744,181 B1 * | 6/2004 | Ogiura et al. ............... 310/357 |
| 6,986,565 B2 * | 1/2006 | Watanabe et al. ............. 347/71 |
| 7,149,318 B2 * | 12/2006 | Bank et al. ................. 381/190 |
| 7,247,976 B2 * | 7/2007 | Sashida et al. .............. 310/330 |
| 2005/0023937 A1 * | 2/2005 | Sashida et al. .............. 310/348 |
| 2005/0062806 A1 * | 3/2005 | Terakura et al. .............. 347/72 |
| 2005/0253487 A1 * | 11/2005 | Allan et al. ................. 310/331 |
| 2006/0221112 A1 * | 10/2006 | Ito ............................ 347/17 |
| 2007/0236107 A1 * | 10/2007 | Maruyama et al. ........... 310/366 |

FOREIGN PATENT DOCUMENTS

JP    2006121769    5/2006

* cited by examiner

*Primary Examiner* — Walter Benson
*Assistant Examiner* — Bryan P Gordon
(74) *Attorney, Agent, or Firm* — Adams & Wilks

(57) ABSTRACT

To provide a piezoelectric actuator that is small in size, large in displacement, high in rigidity, excellent in controllability, and excellent in stability, the present invention provides a piezoelectric actuator, including: a first piezoelectric member that is bent and displaced in a thickness direction; and a second piezoelectric member that is bent and displaced in a direction opposite to the first piezoelectric member. In the piezoelectric actuator, the first piezoelectric member and the second piezoelectric member are stacked on each other in the thickness direction of the first piezoelectric member and the second piezoelectric member, and the center portion in the longitudinal direction of the first piezoelectric member and the center portion in the longitudinal direction of the second piezoelectric member, or both ends of the first piezoelectric member and both ends of the second piezoelectric member are fixed to each other.

15 Claims, 5 Drawing Sheets

PIEZOELECTRIC ACTUATOR AND ELECTRONICS DEVICE USING THE SAME

BACKGROUND OF THE INVENTION

1. Field of the Invention

The present invention relates to a piezoelectric actuator, and more particularly to an actuator that is incorporated into an electronic device such as a camera or an information recording device, and serves as a drive source that precisely moves a driven unit such as a lens, and an electronic device using the actuator.

2. Description of the Related Art

In recent years, improvements in function and performance of the electronic device have been advanced, and diverse principles are applied to the actuators used in the electronic devices. In particular, a piezoelectric actuator using the piezoelectric element can be precisely positioned, is superior in responsiveness, and can be directly driven. Therefore, an attempt is made to apply the piezoelectric actuator to the positioning of the lens or a pickup in the information recording device. In particular, the piezoelectric actuator of a bimorph type having a structure in which two piezoelectric elements are bonded together and generating a bend displacement is widely used because the displacement is larger than that of the piezoelectric actuators of other types. However, in order to address a need for larger displacement output, the length of a piezoelectric element must be lengthened, and the thickness of the piezoelectric element must be thinned. As a result, the piezoelectric actuator is not practical in view of the size, rigidity, and strength.

Under the circumstances, there has been known a structure in which a plurality of bimorph elements are stacked on each other in a thickness direction (direction of the bend displacement), and one ends of the respective bimorph elements are bonded together to obtain a large displacement. A structure has been proposed in which two or even number of units each having a pair of bimorph elements that cross each other in an X-shaped configuration are stacked on each other, and fixed to each other.

However, the actuator disclosed in JP 2006-121769 A has a portion where the bimorph elements cross each other in the X-shaped configuration, and therefore the structure is complicated, the assembling is difficult, and a gap must be defined between the bimorph elements that cross each other to provide the X-shaped configuration. This leads to an increase in the size of the actuator. Further, with the above configuration, the rigidity of the actuator is reduced, and a responsiveness and the positioning controllability are deteriorated. At the same time, there arises such a problem that the actuator is liable to be affected by a posture difference to be used or a disturbance such as vibrations from outside.

SUMMARY OF THE INVENTION

It is an object of the present invention is to provide a piezoelectric actuator that is small in size, large in displacement, high in rigidity, excellent in controllability, and excellent in stability.

In order to solve the above-mentioned problems, according to an aspect of the present invention, there is provided a piezoelectric actuator including: a first piezoelectric member that is bent and displaced (deformed) in a thickness direction; and a second piezoelectric member that is bent and displaced (deformed) in a direction opposite or inverse to the displacement direction of the first piezoelectric member. In the piezoelectric actuator, the first piezoelectric member and the second piezoelectric member are stacked or superposed over each other in spaced relation in the thickness direction of the first piezoelectric member and the second piezoelectric member, and a center portion in a longitudinal direction of the first piezoelectric member and a center portion in a longitudinal direction of the second piezoelectric member are fixed to each other. According to the structure, there can be realized the piezoelectric actuator that is high in rigidity and large in displacement.

Further, a plurality of piezoelectric actuators are disposed in a direction of the bend displacement, and both ends in the longitudinal direction of piezoelectric members are fixed to each other at a position where two piezoelectric actuators are adjacent to each other, to constitute the piezoelectric actuator. According to this configuration, the piezoelectric actuator that is larger in displacement can be realized.

According to another aspect of the present invention, there is provided a piezoelectric actuator, including: a first piezoelectric member that is bent and displaced in thickness; and a second piezoelectric member that is bent and displaced in a direction opposite to the first piezoelectric member. In the piezoelectric actuator, the first piezoelectric member and the second piezoelectric member are stacked on each other in the thickness direction of the first piezoelectric member and the second piezoelectric member, and both ends in a longitudinal direction of the first piezoelectric member and both ends in a longitudinal direction of the second piezoelectric member are fixed to each other. According to the structure, there can be realized the piezoelectric actuator that is high in rigidity and large in displacement.

Further, a plurality of piezoelectric actuators are disposed in a direction of the bend displacement, and both ends in the longitudinal direction of piezoelectric members are fixed to each other at a position where the piezoelectric actuators are adjacent to each other, to constitute the piezoelectric actuator. According to this configuration, the piezoelectric actuator that is larger in displacement can be realized.

Further, the plurality of piezoelectric actuators are disposed in the longitudinal direction of the piezoelectric member, and two adjacent piezoelectric members are fixed to each other to constitute the piezoelectric actuator. According to this configuration, the rigidity of the piezoelectric actuator is further increased.

According to the present invention, the piezoelectric actuator having a structure that is capable of generating the large displacement and has the high rigidity is obtained. Accordingly, the piezoelectric actuator according to the present invention is excellent in controllability and reliability. Further, it is possible to downsize the electronic device that incorporates the actuator and reduce the power consumption.

DETAILED DESCRIPTION OF THE PREFERRED EMBODIMENTS

Hereinafter, a description will be given of embodiments of the present invention with reference to the accompanying drawings.

First Embodiment

Figure 1:
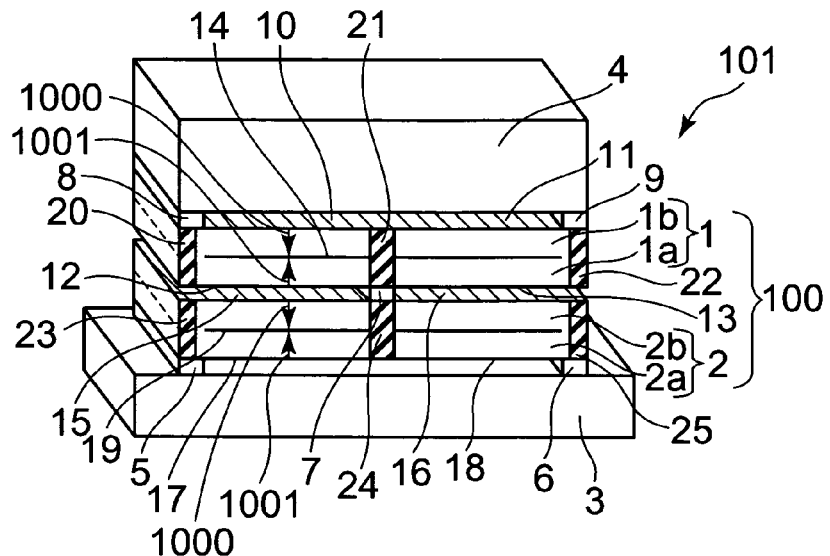
FIG. 1 is a diagram showing the entire structure of a piezoelectric actuator according to a first embodiment of the present invention.
Figure 2A:
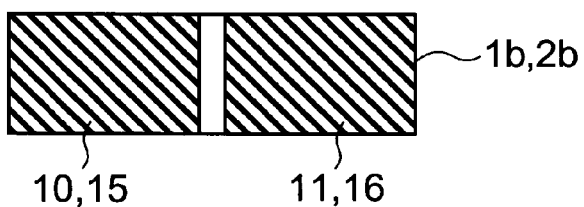
FIGS. 2A to 2C are diagrams showing an electrode structure of a piezoelectric element used in the piezoelectric actuator according to the first embodiment of the present invention.
Figure 2B:
Figure 2C:
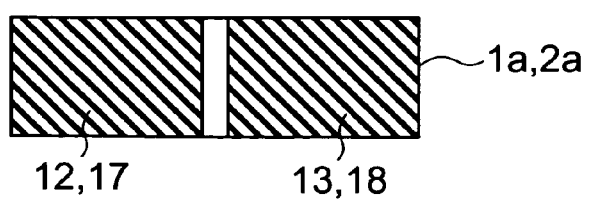
Figure 3:
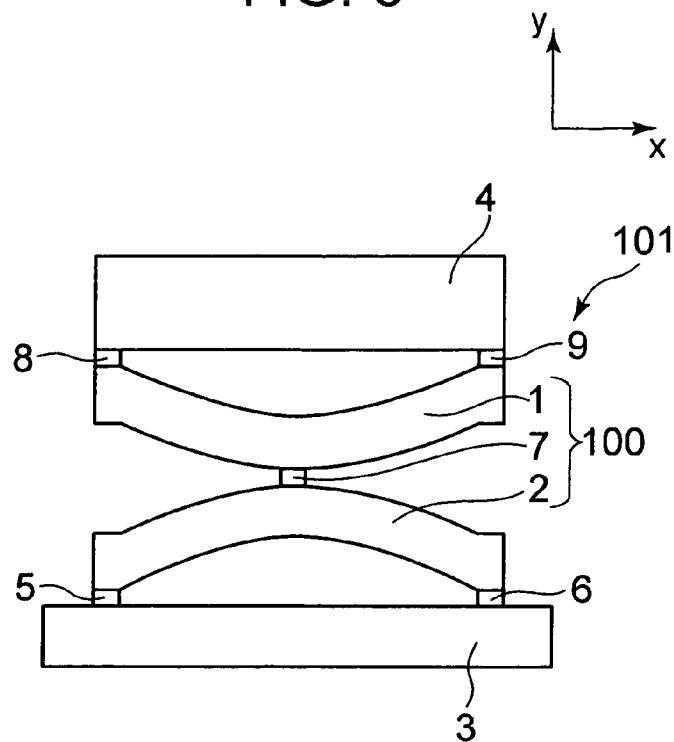
FIG. 3 is a diagram showing a drive state of the piezoelectric actuator according to the first embodiment of the present invention.

A description will be given of the structure and operation of piezoelectric actuators 100 and 101 according to the present invention with reference to FIGS. 1, 2, and 3. FIG. 1 is a diagram showing the entire structure of piezoelectric actuators 100 and 101. FIGS. 2A to 2C are diagrams showing the electrode structure of piezoelectric members 1 and 2. FIG. 2A is a diagram showing electrodes that are disposed on the upper surfaces of piezoelectric elements 1b and 2b that constitute the piezoelectric members 1 and 2, and FIG. 2B is a diagram showing electrodes 14 and 19 that are disposed on the upper surfaces of piezoelectric elements 1a and 2a that constitute the piezoelectric members 1 and 2. FIG. 2C is a diagram showing electrodes that are disposed on the lower surfaces of the piezoelectric elements 1a and 2a. FIG. 3 is a diagram showing the drive state of the piezoelectric actuators 100 and 101.

The piezoelectric actuator 101 according to the present invention includes the piezoelectric members 1 and 2 that are rectangular and stacked over each other in superposed spaced-apart relationship in the thickness direction. A fixing member 7 is disposed between the piezoelectric member 1 and the piezoelectric member 2 and fixes a center portion in the longitudinal direction of the piezoelectric member 1 and a center portion of the piezoelectric member 2. The piezoelectric actuator 101 also includes an operative member 4 and a support member 3 which are arranged so as to sandwich the piezoelectric members 1 and 2 from both sides of the piezoelectric members 1 and 2 in the thickness direction, and a fixing members 8 and 9 that fix the piezoelectric member 1 and the operative member 4 at both sides (opposite ends) of the piezoelectric member 1 in the longitudinal direction. Further, the piezoelectric actuator 101 includes fixing members 5 and 6 that fix the piezoelectric member 2 and the support member 3 at both ends in the longitudinal direction of the piezoelectric member 2. The piezoelectric actuator 100 indicates a portion made up of the piezoelectric member 1, the piezoelectric member 2, and the fixing member 7.

The piezoelectric member 1 is of a structure in which the two piezoelectric elements 1a and 1b are stacked on each other, and functions as a so-called bimorph type piezoelectric actuator. Electrodes 10 and 11 are disposed on the upper surface of the piezoelectric element 1b in two divided regions except for a center portion in the longitudinal direction of the piezoelectric element 1b. An electrode 14 is disposed on the entire upper surface of the piezoelectric element 1a except for both ends in the longitudinal direction of the piezoelectric member 2. Electrodes 12 and 13 are disposed on the lower surface of the piezoelectric element 1a in two divided regions except for a center portion in the longitudinal direction of the piezoelectric element 1a. The piezoelectric member 2 is also of the bimorph structure that is made up of two piezoelectric elements 2a and 2b, which is identical with the structure of the piezoelectric member 1. The electrodes 10, 11, 12, 13, and 14 in the piezoelectric member 1 correspond to electrodes 15, 16, 17, 18, and 19 in the piezoelectric member 2, respectively.

The piezoelectric elements 1a, 1b, 2a, and 2b are polarized in the directions indicated by arrows 1000 and 1001 in the figure. The polarization is conducted by applying a high voltage between the electrode 14 and the electrodes 10, 11, 12, and 13, and between the electrode 19 and the electrodes 15, 16, 17, and 18. A side electrode 21 is disposed at a side of the center portion in the longitudinal direction of the piezoelectric member 1, and short-circuits the electrode 14. Side electrodes 20 and 22 are disposed at sides of both ends in the longitudinal direction of the piezoelectric member 1. The side electrode 20 short-circuits the electrodes 10 and 12, and the side electrode 22 short-circuits the electrodes 11 and 13. Further, a side electrode 24 is disposed at the side of the center portion in the longitudinal direction of the piezoelectric member 2, and short-circuits the electrode 19. Side electrodes 23 and 25 are disposed at the sides of both ends in the longitudinal direction of the piezoelectric member 2. The side electrode 23 short-circuits the electrodes 15 and 17, and the side electrode 25 short-circuits the electrodes 16 and 18. Those side electrodes 20, 21, 22, 23, 24, and 25 are polarized and thereafter applied. Alternatively, it is possible that an electrode is disposed on a side of the fixing member 7, and short-circuits the side electrode 21 and the side electrode 24. In this case, it is possible to reduce the number of lead wirings not shown in the figure which are connected to the electrode.

Now, a method of driving the piezoelectric actuators 100 and 101 will be described. A drive signal that is applied to the piezoelectric actuators 100 and 101 is a DC voltage, and voltages different from each other in the polarity are applied to the side electrodes 20, 22 and the side electrodes 23, 25 with the side electrodes 21 and 24 as GND. For example, a voltage of +10 V is applied to the side electrodes 20 and 22 with the side electrodes 21 and 24 as GND, and a voltage of −10V is applied to the side electrodes 23 and 25. As a result, both of the piezoelectric member 1 and the piezoelectric member 2 which are the actuator of the bimorph type are bent and displaced in the thickness direction of the piezoelectric members 1 and 2 as shown in FIG. 3, but the displacement direction is opposite to each other. As a result, the displacement of the piezoelectric actuators 100 and 101 are in the y-axial direction in the figure. With the above principle, the amount of displacement twice as large as that in the case having only one piezoelectric member is obtained. Further, in order to reverse the displacement direction, the polarity of a signal that is applied to the side electrodes 20 and 22, and the polarity of a signal that is applied to the side electrodes 23 and 25 can be reversed, respectively. Further, the amount of displacement of the piezoelectric actuators 100 and 101 is controlled by changing the magnitude of the voltage of the signal which is applied to the piezoelectric members 1 and 2.

As described above, a portion where the piezoelectric member 1 and the piezoelectric member 2 are fixed to each other, a portion where the piezoelectric member 1 and the operative member 4 are fixed to each other, and a portion where the piezoelectric member 2 and the support member 3 are fixed to each other are non-driven portions where no distortion occurs due to the piezoelectric effect caused by supplying the drive signal. As a result, it is possible to prevent the members of the fixing portions from being peeled off from each other during driving.

Further, with the provision of the side electrodes 20, 21, 22, 23, 24, and 25 on portions that are non-driven portions of the piezoelectric members 1 and 2, the drive electrode can be disposed over the entire surface of other portions of the piezoelectric members 1 and 2. For that reason, no unbalance occurs in the entire displacement distribution as the displacements of the piezoelectric actuators 100 and 101 become larger.

Incidentally, the structure and the polarization direction of the piezoelectric members 1 and 2 as well as the drive signal are described in detail above. The configuration of the piezoelectric members 1 and 2 is not limited when the piezoelectric members 1 and 2 function as the bimorph element. The piezoelectric members 1 and 2 can be constituted by a laminate piezoelectric element having three or more piezoelectric elements stacked on each other.

Further, in a method of fabricating the piezoelectric actuators 100 and 101, the piezoelectric members 1 and 2, the fixing members 5, 6, 7, 8 and 9, the operative member 4, and the support member 3 can be joined by using an adhesive. Alternatively, at least the piezoelectric members 1 and 2, and the fixing member 7 are made of piezoelectric ceramics, to thereby make it possible to manufacture those members integrally. For example, a piezoelectric sheet having the piezoelectric element 2a, a piezoelectric sheet having the piezoelectric element 2b, a piezoelectric sheet having the fixing member 7, a piezoelectric sheet having the piezoelectric element 1a, and a piezoelectric sheet having the piezoelectric element 1b are stacked on each other, and then integrally sintered. In this example, when resin or carbon paste is disposed in the periphery of the fixing member 7 in the piezoelectric sheet having the fixing member 7, since the resin or carbon paste is burned away or melted and dried up at the time of sintering, only the fixing portion 7 remains. With the application of the above process, it is possible to manufacture the piezoelectric actuator 100 that is high in the reliability, and small in the performance variation in large numbers and inexpensively.

Second Embodiment

Figure 4:
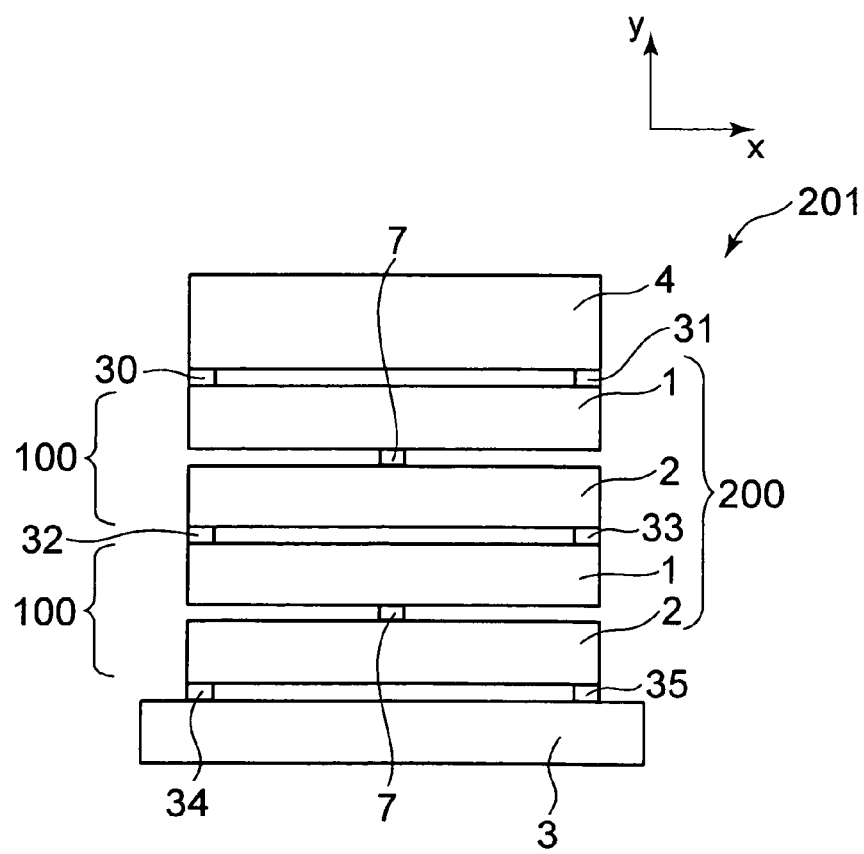
FIG. 4 is a diagram showing the structure of a piezoelectric actuator according to a second embodiment of the present invention.

A second embodiment of the present invention will be described with reference to FIG. 4. In this embodiment, differences between the piezoelectric actuators 100 and 101 described in the first embodiment will be mainly described.

A piezoelectric actuator 200 is constituted as follows. That is, two piezoelectric actuators 100 each having the piezoelectric members 1, 2, and the fixing member 7 in the piezoelectric actuator 100 as described in the first embodiment are disposed in a direction of the bent displacement of the piezoelectric members 1 and 2 (y-axial direction indicated by an arrow in the figure). Both ends in the longitudinal direction of the piezoelectric members 1 and 2 that constitute the adjacent piezoelectric actuators are fixed to each other through fixing members 32 and 33 to constitute the piezoelectric actuator 200. Further, the operative member 4 is fixed through the fixing members 30 and 31 by both ends in the longitudinal direction of two piezoelectric members 1, which are positioned at both ends of the piezoelectric actuator 200 in the y-axial direction indicated by an arrow. Further, the support member 3 is fixed at both ends in the longitudinal direction of the piezoelectric member 2 through the fixing members 34 and 35 to constitute the piezoelectric actuator 201. As in the piezoelectric actuators 100 and 101, the piezoelectric member 1 and the piezoelectric member 2 are bent and displaced in directions opposite to each other. As a result, the piezoelectric actuators 200 and 201 are displaced in the y-axial direction in the figure as a sum of the displacements of the respective piezoelectric members 1 and 2.

In this embodiment, two piezoelectric actuators 100 each having the piezoelectric members 1, 2, and the fixing member 7 are disposed. When the number of piezoelectric actuators 100 is increased, the displacement of the piezoelectric actuators 200 and 201 is increased in proportion to the number of piezoelectric actuators 100.

Third Embodiment

Figure 5:
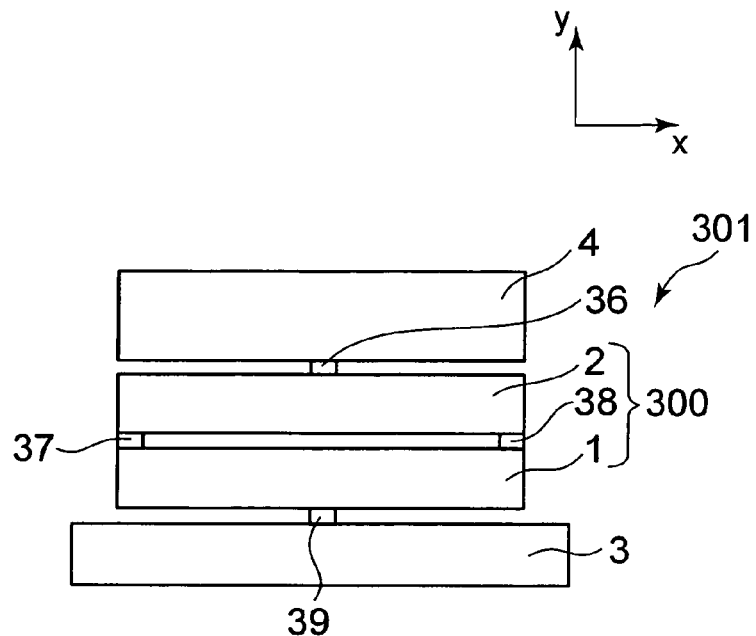
FIG. 5 is a diagram showing the structure of a piezoelectric actuator according to a third embodiment of the present invention.

A third embodiment of the present invention will be described with reference to FIG. 5. In this embodiment, differences between the piezoelectric actuators 100 and 101 described in the first embodiment will be mainly described.

A piezoelectric actuator 300 is constituted as follows. That is, the piezoelectric members 1 and 2 in the piezoelectric actuator 100 described in the first embodiment are stacked on each other in the thickness direction thereof. Both ends in the longitudinal direction of the piezoelectric members 1 and 2 are fixed to each other through fixing members 37 and 38 to constitute the piezoelectric actuator 300. Further, the operative member 4 is fixed at the center portion in the longitudinal direction of the piezoelectric member 2 through a fixing member 36, and the support member 3 is fixed at the center portion in the longitudinal direction of the piezoelectric member 1 through a fixing member 39 to constitute a piezoelectric actuator 301. Similarly, as in the piezoelectric actuators 100 and 101, the piezoelectric member 1 and the piezoelectric member 2 are bent and displaced in directions opposite to each other. As a result, the piezoelectric actuators 300 and 301 are displaced in the y-axial direction in the figure as a sum of the displacements of the respective piezoelectric members 1 and 2.

Fourth Embodiment

Figure 6:
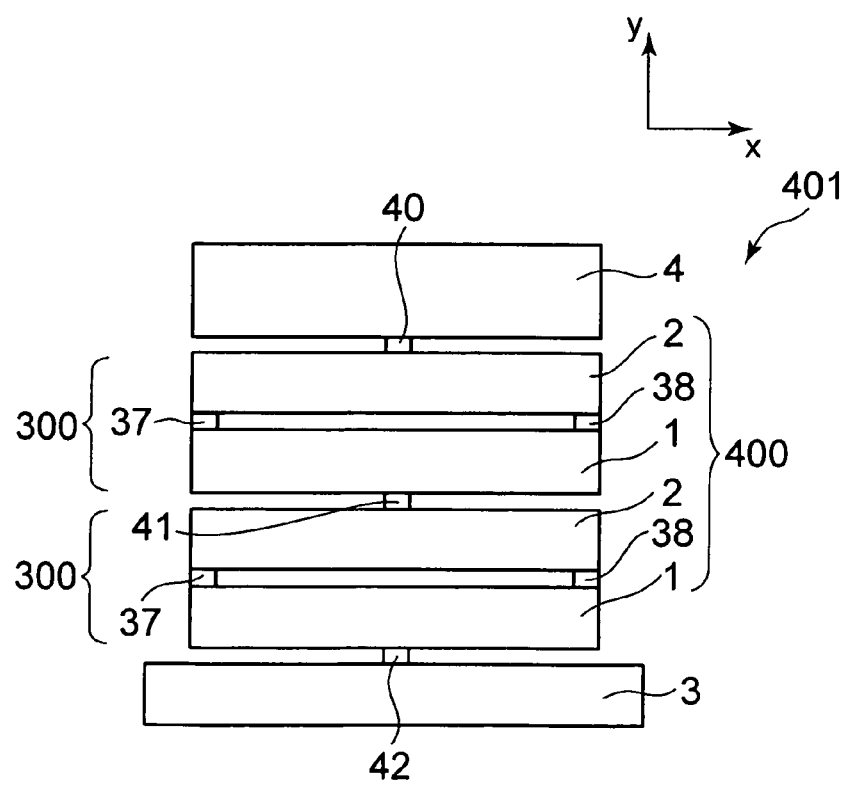
FIG. 6 is a diagram showing the structure of a piezoelectric actuator according to a fourth embodiment of the present invention.

A fourth embodiment of the present invention will be described with reference to FIG. 6. In this embodiment, differences between the piezoelectric actuators 300 and 301 described in the third embodiment will be mainly described.

A piezoelectric actuator 400 is constituted as follows. That is, two piezoelectric actuators 300 each having the piezoelectric members 1, 2 and the fixing members 37, 38 in the piezoelectric actuator 301 described in the third embodiment are disposed in the direction of the bent displacement of the piezoelectric members 1 and 2 (y-axial direction). The center portions in the longitudinal direction of the piezoelectric members 1 and 2, which constitute the adjacent piezoelectric actuators, are fixed to each other through a fixing member 41 to constitute the piezoelectric actuator 400. Further, the operative member 4 is fixed through a fixing member 40 by the center portions in the longitudinal direction of the piezoelectric member 2 which are positioned at both ends of the piezoelectric actuator 400 in the y-axial direction. The support member 3 is fixed at the center portion in the longitudinal direction of the piezoelectric member 1 through a fixing member 42 to constitute a piezoelectric actuator 401. Similarly, as in the piezoelectric actuators 300 and 301, the piezoelectric member 1 and the piezoelectric member 2 are bent and displaced in directions opposite to each other. As a result, the piezoelectric actuators 400 and 401 are displaced in the y-axial direction in the figure as a sum of the displacements of the respective piezoelectric members 1 and 2.

In this embodiment, two piezoelectric actuators 300 each having the piezoelectric members 1, 2, and the fixing members 37, 38 are disposed. When the number of piezoelectric actuators 300 is increased, the displacement of the piezoelectric actuators 400 and 401 is increased in proportion to the number of piezoelectric actuators 300.

Fifth Embodiment

Figure 7:
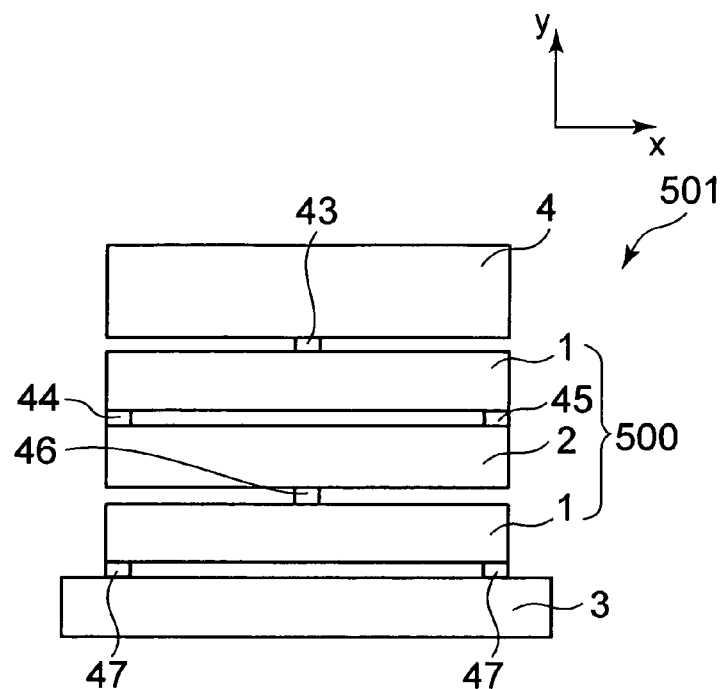
FIG. 7 is a diagram showing the structure of a piezoelectric actuator according to a fifth embodiment of the present invention.

A fifth embodiment of the present invention will be described with reference to FIG. 7. In this embodiment, differences among the piezoelectric actuators 100, 101, 300, and 301 described in the first and third embodiments will be mainly described.

In a piezoelectric actuator 500 according to the present invention, the rectangular piezoelectric members 1, 2, and another piezoelectric member 1 are sequentially stacked on each other in the thickness direction. The center portion in the longitudinal direction of the piezoelectric member 1 and the center portion in the longitudinal direction of the piezoelectric member 2 are fixed to each other through a fixing member 46. Further, the piezoelectric member 2 and the another piezoelectric member 1 are fixed at both ends in the longitudinal direction of the piezoelectric members 1 and 2 through fixing members 44 and 45. Then, the center portion in the longitudinal direction of the another piezoelectric member 1 is fixed to the operative member 4 through a fixing member 43. Both ends in the longitudinal direction of the piezoelectric member 1 and the support member 3 are fixed to each other at both ends in the longitudinal direction of the piezoelectric element 1 through fixing members 47 and 48 to constitute the piezoelectric actuator 501.

The piezoelectric member 1 and the piezoelectric member 2 are bent and displaced in directions opposite to each other. As a result, the piezoelectric actuators 500 and 501 are displaced in the y-axial direction in the figure as a sum of the displacements of the respective piezoelectric members 1 and 2. The piezoelectric actuators 500 and 501 are configured in such a manner that the piezoelectric member 1 or the piezoelectric member 2 is further stacked on and connected to the piezoelectric actuators 100, 101 and the piezoelectric actuators 300, 301. Accordingly, it is possible that the piezoelectric member 1 or the piezoelectric member 2 is further stacked on and connected to the piezoelectric actuator 200 described in the second embodiment or the piezoelectric actuator 400 described in the fourth embodiment to constitute the piezoelectric actuator.

In the case where the piezoelectric member 1 is connected to the piezoelectric actuator 200, the piezoelectric actuator 200 is newly connected to the piezoelectric member 1 through a fixing member at both ends in the longitudinal direction of the piezoelectric member 2, which constitutes the piezoelectric actuator 200 and is positioned at one end in the y-axial direction. In the case where the piezoelectric member 2 is connected to the piezoelectric actuator 200, the piezoelectric actuator 200 is newly connected to the piezoelectric member 2 through a fixing member at both ends in the longitudinal direction of the piezoelectric member 1, which constitutes the piezoelectric actuator 200 and is positioned at one end in the y-axial direction.

In the case where the piezoelectric member 1 is connected to the piezoelectric actuator 400, the piezoelectric actuator 400 is newly connected to the piezoelectric member 1 through a fixing member at the center portion in the longitudinal direction of the piezoelectric member 2, which constitutes the piezoelectric actuator 400 and is positioned at one end in the y-axial direction. In the case where the piezoelectric member 2 is connected to the piezoelectric actuator 400, the piezoelectric actuator 400 is newly connected to the piezoelectric member 2 through a fixing member in the center portion in the longitudinal direction of the piezoelectric member 1, which constitutes the piezoelectric actuator 400 and is positioned at one end in the y-axial direction.

Sixth Embodiment

Figure 8:
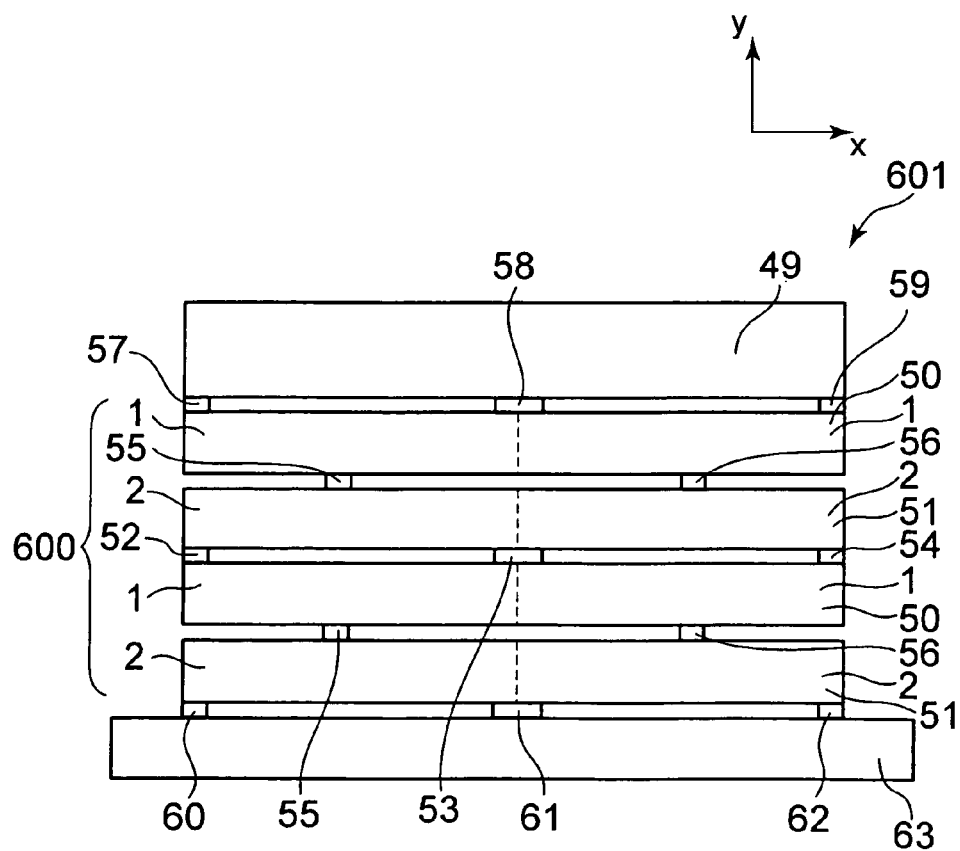
FIG. 8 is a diagram showing the structure of a piezoelectric actuator according to a sixth embodiment of the present invention.

A sixth embodiment of the present invention will be described with reference to FIG. 8. In this embodiment, differences between the piezoelectric actuators 200 and 201 described in the above embodiment will be mainly described.

A piezoelectric actuator 600 according to the present invention is made up of the respective two rectangular piezoelectric members 50 and 51, and fixing members 52, 53, 54, 55, and 56 which couple the piezoelectric members 50 and 51 with each other. The piezoelectric members 50 and 51 are arranged in the stated order of the piezoelectric members 50, 51, 50, and 51 in the thickness direction thereof from above in the figure. The piezoelectric member 50 is of the structure in which two piezoelectric members 1 described in the first embodiment are arranged in the longitudinal direction of the piezoelectric member 1 and coupled with each other. The piezoelectric member 50 can be made up of one piezoelectric member, or two piezoelectric members 1 can be coupled with each other by adhering means or the like. The piezoelectric member 51 is structured in such a manner that two piezoelectric members 2 described in the first embodiment are arranged in the longitudinal direction of the piezoelectric member 1 and coupled with each other. The piezoelectric member 51 can be constituted by one piezoelectric member, or can be constituted by coupling two piezoelectric members 1 by the aid of the adhering means or the like.

In the figure, the uppermost piezoelectric member 50 and the second upper piezoelectric member 51 are coupled with each other through the fixing members 55 and 56 at the center portions in the longitudinal direction of the two piezoelectric member 1 and piezoelectric member 2 which constitute those piezoelectric members 50 and 51. The second upper piezoelectric member 51 and the third upper piezoelectric member 50 are coupled with each other through the fixing members 52, 54, and 53 at both ends in the longitudinal direction of those piezoelectric members 51 and 50 and in the center portions in the longitudinal direction thereof, respectively. The third upper piezoelectric member 50 and the fourth upper piezoelectric member 51 are coupled with each other through the fixing members 55 and 56 in the center portion in the longitudinal direction of the two piezoelectric member 1 and piezoelectric member 2 which constitute those piezoelectric members 50 and 51.

A piezoelectric actuator 601 is made up of the piezoelectric actuator 600, a support member 63 that fixes the piezoelectric actuator 600, an operative member 49 that is driven by the piezoelectric actuator 600, and fixing members 57, 58, 59, 60, 61, and 62 which couple the piezoelectric actuator 600 with the support member 63 and the operative member 49, respectively. The support member 63 and the piezoelectric actuator 600 are coupled with each other through the fixing members 60, 62, and 61 at both ends and in the center portion of the fourth upper piezoelectric member 51 that constitutes the piezoelectric actuator 600. The operative member 49 and the piezoelectric actuator 600 are coupled with each other through the fixing members 57, 59, and 58 at both ends and in the center portion of the uppermost piezoelectric member 50 that constitutes the piezoelectric actuator 600.

In a method of driving the piezoelectric actuators 600 and 601, the piezoelectric member 50 and the piezoelectric member 51 are bent and displaced in directions opposite to each other. That is, the piezoelectric member 1 and the piezoelectric member 2 are bent and displaced in directions opposite to each other, as a result of which the piezoelectric actuators 600 and 601 are displaced in the y-axial direction in the figure as a sum of the displacements of the respective piezoelectric members 50 and 51 in the y-axial direction.

As described above, the piezoelectric actuators 600 and 601 can be configured in such a manner that the respective two piezoelectric actuators 200 and 201 are disposed in the longitudinal direction of the piezoelectric members 1 and 2 that apparently constitute the piezoelectric actuators 200 and 201, and the adjacent piezoelectric members are coupled with each other. Accordingly, it is possible that the piezoelectric actuators 100, 101, 300, 301, 400, 401, 500, and 501 are used, and at least one of the piezoelectric actuators 100, 101, 300, 301, 400, 401, 500, and 501 having the same configuration is arranged in the longitudinal direction of the piezoelectric members that constitute the above piezoelectric actuators to be used, and the adjacent piezoelectric members are fixed to each other to constitute the piezoelectric actuator. As the number of piezoelectric actuators 200, 201, 300, 301, 400, 401, 500, and 501 which are disposed in parallel is increased more, the rigidity of the piezoelectric actuator that has been finally constituted is increased more.

As described above, a plurality of piezoelectric actuators having the same configuration are arranged in a direction (x-axial direction) orthogonal to the displacement direction (y-axial direction), and coupled with each other, thereby making it possible to increase the rigidity while keeping the displacement as compared with a case using one piezoelectric actuator. Further, the piezoelectric actuator withstands a deformation that is caused by sintering the piezoelectric element that constitutes the piezoelectric actuator, thereby making it possible to reduce the manufacture variation.

Seventh Embodiment

A seventh embodiment of the present invention will be described with reference to FIGS. 9 and 10.

Figure 9A:
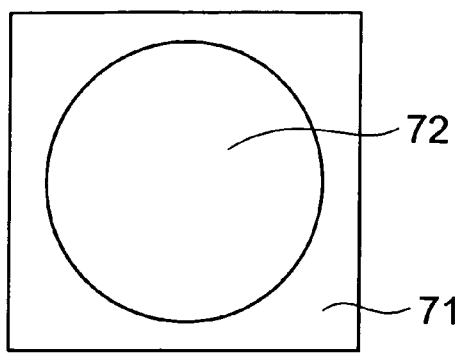
FIGS. 9A and 9B are diagrams showing the structure of a piezoelectric actuator that is incorporated in an electronic device according to a seventh embodiment of the present invention.
Figure 9B:
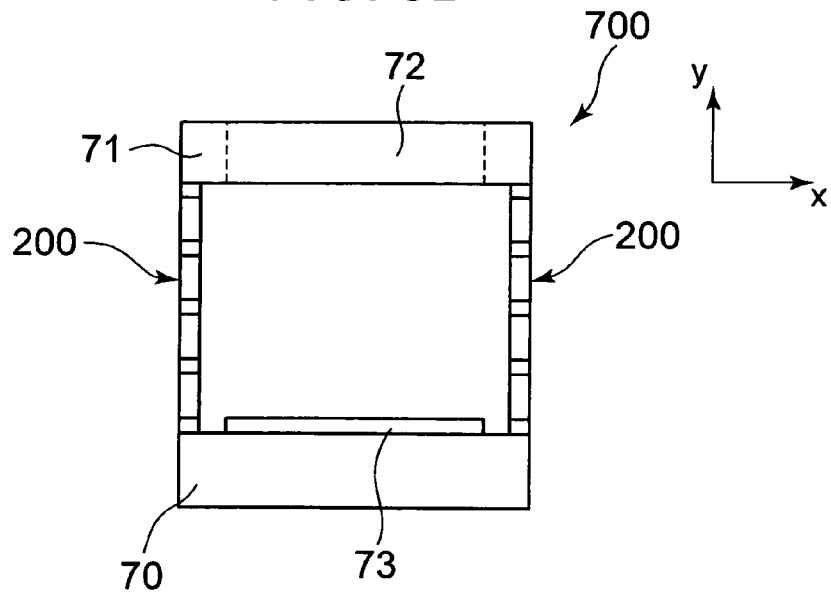

FIGS. 9A and 9B are diagrams showing a piezoelectric actuator 700 that is incorporated into an electronic device according to the present invention. FIG. 9A is a top view of the piezoelectric actuator 700, and FIG. 9B is a side view thereof. The piezoelectric actuator 700 is of the structure in which an operative member 71 and a support member 70 are fixed on the upper and lower surfaces of the two piezoelectric actuators 200 that are disposed in parallel, respectively. A lens 72 that is a controlled member is disposed in the center of the operative member 71, and an image pickup element 73 is disposed on the support member 70. In this embodiment, the image pickup element 73 is formed of a CCD or a C-MOS sensor. A drive signal is supplied to the two piezoelectric actuators 200, and the operative member 71 and the controlled member (lens) 72 are driven in the y-direction in the figure. As a result, a light that has passed through the controlled member (lens) 72 is focused on the image pickup element 73. With the above configuration, the piezoelectric actuator 700 functions as an auto focus driver device.

Figure 10:
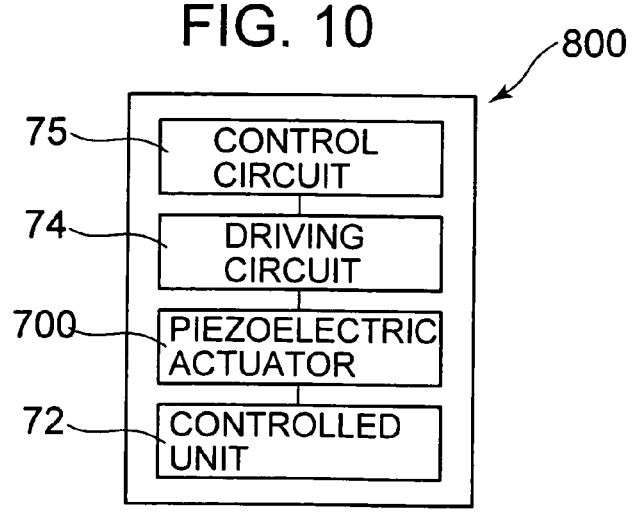
FIG. 10 is a block diagram showing the electric device according to the seventh embodiment of the present invention.

FIG. 10 is a block diagram showing an electronic device 800 incorporates the piezoelectric actuator 700 of the present invention. In this figure, the electronic device 800 is a digital camera. When a user touches a shutter not shown in the figure, a driving circuit 74 supplies the drive signal to the piezoelectric actuator 700 on the basis of an instruction signal from a control circuit 75. The lens 72 that is a controlled unit operates on the basis of the operation of the piezoelectric actuator 700, and the control circuit 75 outputs the instruction signal to the driving circuit 74 on the basis of the information from the image pickup element 73 not shown in the figure, and positions the lens 72 so as to be focused. When the shutter not shown in the figure is depressed in this state, an image that has been taken on the image pickup element 73 is retrieved into a memory not shown in the figure.

In this embodiment, the piezoelectric actuator 200 is shown as a drive source of the piezoelectric actuator 700. However, any one of piezoelectric actuators described in the first to sixth embodiments can be used. Further, a digital camera is exemplified as the electronic device 800. Alternatively, the piezoelectric actuator can be used for spherical aberration correction or the like of another electronic device, for example, a DVD. In any cases, the electronic device 800 using the piezoelectric actuator of the present invention can be downsized and reduced in the power consumption.

INDUSTRIAL APPLICABILITY

The piezoelectric actuator according to the present invention can generate a large displacement while keeping a small size, can conduct precise positioning, and is low in the power consumption. Therefore, the piezoelectric actuator of the present invention can be applied to the driving of a pickup in an optical disk or a magnetic disk, the driving of an adjusting mechanism (part such as a lens or a prism) of the optical system in the optical disk, or the lens driving in an auto focus mechanism of the camera, and the like. Further, since a plurality of piezoelectric actuators are used to enable multiaxial driving, the piezoelectric actuator of the present invention can also be applied as an x-y micromotion device in a microscope or a measuring device as well as an image stabilizer in the camera or a video camera.

What is claimed is:

1. A piezoelectric actuator, comprising:
a first piezoelectric member that is bendable and displaceable in a thickness direction thereof;
a second piezoelectric member that is bendable and displaceable in a thickness direction thereof opposite to the displacement direction of the first piezoelectric member;
an operative member fixed to both ends in the longitudinal direction of one of the two piezoelectric members; and
a support member fixed to both ends in the longitudinal direction of the other of the two piezoelectric members,
wherein the first piezoelectric member and the second piezoelectric member are superposed over and spaced from each other in the thickness direction of the first piezoelectric member and the second piezoelectric member, and a center portion in a longitudinal direction of the first piezoelectric member and a center portion in a longitudinal direction of the second piezoelectric member are fixed to each other so that the first and second piezoelectric members undergo simultaneous bending displacement in opposite directions relative to the fixed center portions in response to input of a piezoelectric actuator drive signal to thereby displace the operative member relative to the support member.

2. A piezoelectric actuator, comprising:
a first piezoelectric member that is bendable and displaceable in a thickness direction thereof,
a second piezoelectric member that is bendable and displaceable in a thickness direction thereof opposite to the displacement direction of the first piezoelectric member,
an operative member fixed to a center portion in the longitudinal direction of one of the two piezoelectric members; and
a support member fixed to a center portion in the longitudinal direction of the other of the two piezoelectric members,
wherein the first piezoelectric member and the second piezoelectric member are superposed over and spaced from each other in the thickness direction of the first piezoelectric member and the second piezoelectric member, and both ends in a longitudinal direction of the first piezoelectric member and both ends in a longitudinal direction of the second piezoelectric member are fixed to each other so that the first and second piezoelectric members undergo simultaneous bending displacement in opposite directions relative to the fixed ends in response to input of a piezoelectric actuator drive signal to thereby displace the operative member relative to the support member.

3. A piezoelectric actuator according to claim 1; wherein a plurality of the piezoelectric actuators are disposed in a row in the longitudinal direction of the piezoelectric members, the piezoelectric members that are adjacent in the longitudinal direction of each row are fixed to each other, and one piezoelectric member of each piezoelectric actuator is fixed at both ends in the longitudinal direction thereof to the operative member and the other piezoelectric member of each piezoelectric actuator is fixed at both ends in the longitudinal direction thereof to the support member.

4. A piezoelectric actuator according to claim 1; wherein the piezoelectric members have a non-driven portion that generates no distortion due to input of the piezoelectric actuator drive signal and that is disposed at a portion where the piezoelectric members are fixed to each other.

5. A piezoelectric actuator according to claim 1; wherein the piezoelectric members have a non-driven portion that generates no distortion due to input of the piezoelectric actuator drive signal and that is disposed at one of a portion where the piezoelectric member and the support member are fixed to each other and a portion where the piezoelectric member and the operative member are fixed to each other.

6. An electronic device, comprising:
a piezoelectric actuator according to claim 1,
a controlled unit which is driven by the piezoelectric actuator;
a driving circuit that supplies a drive signal to the piezoelectric actuator; and
a control circuit that controls the driving circuit.

7. A piezoelectric actuator comprising: first and second piezoelectric members each having a center portion and two opposite end portions and each having electrodes arranged thereon and being deformable in a thickness direction thereof in response to a drive signal applied to the electrodes, the first and second piezoelectric members being superposed over and spaced apart from one another in the thickness direction so as to undergo simultaneous deformation in opposite directions, the first and second piezoelectric members being fixed to one another at either opposed center portions thereof or opposed opposite end portions thereof but not at both the center and end portions, and the first piezoelectric member being fixed to a support member and the second piezoelectric member being fixed to an operative member so that simultaneous deformation of the piezoelectric members in opposite directions displaces the operative member relative to the support member.

8. A piezoelectric actuator comprising: three or more piezoelectric members each having a center portion and two opposite end portions and each having electrodes arranged thereon and being deformable in a thickness direction thereof in response to a drive signal applied to the electrodes, each piezoelectric member being superposed over and spaced apart from an adjacent piezoelectric member in the thickness direction so that each two adjacent piezoelectric members undergo simultaneous deformation in opposite directions, each piezoelectric member being fixed to an adjacent piezoelectric member at either opposed center portions thereof or opposed opposite end portions thereof but not at both the center and end portions, and each piezoelectric member that is superposed between two other piezoelectric members being fixed to one of the two piezoelectric members only at opposed center portions thereof and being fixed to the other of the two piezoelectric members only at opposed opposite end portions thereof.

9. A piezoelectric actuator according to claim 8; wherein the superposed piezoelectric members have one endmost piezoelectric member fixed to a support member and the other endmost piezoelectric member fixed to an operative member so that deformation of the piezoelectric members displaces the operative member relative to the support member.

10. An electronic device comprising:
a piezoelectric actuator according to claim 8;
a driving circuit that supplies a drive signal to the electrodes of the piezoelectric actuator to deform the piezoelectric members; and
a controlled member that is driven by the piezoelectric actuator.

11. An electronic device comprising:
a piezoelectric actuator according to claim 7;
a driving circuit that supplies a drive signal to the electrodes of the piezoelectric actuator to deform the piezoelectric members; and
a controlled member that is connected to the operative member and driven by the piezoelectric actuator.

12. A piezoelectric actuator according to claim 2; wherein the piezoelectric members have a non-driven portion that generates no distortion due to input of the piezoelectric actuator drive signal and that is disposed at a portion where the piezoelectric members are fixed to each other.

13. A piezoelectric actuator according to claim 2; wherein the piezoelectric members have a non-driven portion that generates no distortion due to input of the piezoelectric actuator drive signal and that is disposed at one of a portion where the piezoelectric member and the support member are fixed to each other and a portion where the piezoelectric member and the operative member are fixed to each other.

14. An electronic device, comprising:
a piezoelectric actuator according to claim 2,
a controlled unit which is driven by the piezoelectric actuator;
a driving circuit that supplies a drive signal to the piezoelectric actuator; and
a control circuit that controls the driving circuit.

15. A piezoelectric actuator according to claim 7; wherein a plurality of the piezoelectric actuators are disposed in a row in the longitudinal direction of the piezoelectric members, the piezoelectric members that are adjacent in the longitudinal direction of each row are fixed to each other, and one piezoelectric member of each piezoelectric actuator is fixed at both ends in the longitudinal direction thereof to the operative member and the other piezoelectric member of each piezoelectric actuator is fixed at both ends in the longitudinal direction thereof to the support member.

* * * * *